United States Patent [19]

Davis et al.

[11] Patent Number: 4,954,415

[45] Date of Patent: Sep. 4, 1990

[54] PHOTOINITIATOR COMPOSITIONS CONTAINING O-ACYLTHIOHYDROXAMATE OR AN N-ALKOXYPYRIDINETHIONE AND PHOTOHARDENABLE COMPOSITIONS CONTAINING THE SAME

[75] Inventors: Paul D. Davis, Centerville, Ohio; Gary B. Schuster, Champaign, Ill.; Jacqueline G. Truini, Dayton; Al Fentiman, Miamisburg, both of Ohio

[73] Assignee: The Mead Corporation, Dayton, Ohio

[21] Appl. No.: 321,256

[22] Filed: Mar. 9, 1989

[51] Int. Cl.$^5$ .................... G03F 7/029; G03F 7/031
[52] U.S. Cl. .................... 430/138; 430/281; 430/920; 430/915; 522/16; 522/25; 522/26
[58] Field of Search .................. 522/16, 26, 902, 51, 522/50, 25, 15; 430/138, 281, 920, 921, 922

[56] References Cited

U.S. PATENT DOCUMENTS

| | | | |
|---|---|---|---|
| 4,532,200 | 7/1985 | Arney et al. | 430/138 |
| 4,535,050 | 8/1985 | Adair et al. | 430/138 |
| 4,636,453 | 1/1987 | Keys et al. | 430/138 |
| 4,755,446 | 7/1988 | Keys et al. | 430/138 |
| 4,842,980 | 6/1989 | Gottschalk et al. | 430/138 |
| 4,859,572 | 8/1989 | Farid et al. | 430/281 |

OTHER PUBLICATIONS

Crich "O'Acyl Thiohydroxamates: New and Versatile Sources of Alkyl Radicals for Use in Organic Synthesis", *Aldrichimica Acta*, vol. 20, No. 2, 1987, pp. 33 et. seq.

Barton, et al., "Conversion of Aliphatic and Alicyclic Carboxylic Acids into Nor-Hydroperoxides, Nor-Alcohols, and Nor-Oxo Derivatives Using Radical Chemistry", J. Chem. Soc., Chem. Commun., 1984, pp. 242 et seq.

Barton et al., "The Invention of New Radical Chain Reactions, Part VIII, Radical Chemistry of Thiohydroxamic Esters; a New Method for the Generation of Carbon Radicals from Carboxylic Acids," *Tetrahedron*, vol. 42, No. 19, pp. 3901–3924 (1985).

Barton et al., "The Invention of New Radical Chain Reactions, Part 9, Further Radical Chemistry of Thiohydroxamic Esters; Formation of Carbon–Carbon Bonds", J. Chem. Soc. Perkin Trans. I, pp. 39 et seq. (1986).

*Primary Examiner*—Marion C. McCamish
*Assistant Examiner*—Christopher D. RoDee
*Attorney, Agent, or Firm*—Thompson, Hine and Flory

[57] ABSTRACT

A photoinitiator composition comprising a compound which absorbs actinic radiation and directly or indirectly generates free radicals, and an O-acylthiohydroxamate compound or an N-alkoxypyridine thione; photohardenable compositions containing that photoinitiator composition; and photosensitive materials employing same.

13 Claims, No Drawings

PHOTOINITIATOR COMPOSITIONS CONTAINING O-ACYLTHIOHYDROXAMATE OR AN N-ALKOXYPYRIDINETHIONE AND PHOTOHARDENABLE COMPOSITIONS CONTAINING THE SAME

Background of the Invention

The present invention relates to free radical, addition polymerizable compositions containing an O-acylthiohydroxamate or an N-alkoxypyridinethione as a component of the photoinitiator system and, more particularly, as an autoxidizer.

It is well known that atmospheric oxygen strongly inhibits the radical initiated polymerization of acrylate monomers, and acrylates typically display a pronounced induction time prior to the onset of polymerization. Kinetic measurements have shown that during the induction time, the concentration of oxygen in acrylate monomer declines due to oxidative reactions, and no detectable polymerization begins until the concentration of oxygen is reduced to a few tenths of a percent of the equilibrium value. Thus, the photographic sensitivity of acrylate photopolymerization systems is governed in large part by this photo-oxidation process.

A photographic process based on the photopolymerization of acrylate monomer recently developed by The Mead Corporation is described in U.S. Pat. Nos. 4,399,209 and 4,440,836, among others. The process differs from other imaging systems based on polymerization reactions in that the photosensitive monomer composition is contained within carbonless type microcapsules. Exposure of the imaging sheet hardens the internal phase of the microcapsules and renders them resistant to physical rupture. Thus, a latent image is formed as an image-wise pattern of hard (exposed) and soft (not exposed) microcapsules. The visible image is developed physically by bringing the exposed capsule sheet into contact with a receiver sheet under pressure. Only the soft capsules rupture and deliver colorant, dissolved in the monomer, to the receiver sheet. The result is a direct positive of the original image. It has been shown that the exposure required to produce the first detectable loss in image density in the microencapsulated acrylate system is determined entirely by the efficiency of photo-oxidation rather than acrylate polymerization.

In photohardenable acrylate compositions and presumably other photohardenable compositions in which hardening occurs via free radical addition polymerization, the film speed at which there is a detectable change in the hardness of the composition (i.e., the shoulder speed) is a product of the quantum efficiency with which the initiator system generates free radicals and the quantum efficiency with which it reacts with oxygen. To maximize film speed, both efficiencies must be maximized. It has been proposed in U.S. application Ser. No. 755,400, filed July 16, 1985, to maximize film speed by including a compound in the photoinitiator composition which reacts with oxygen efficiently thereby removing it from the composition such that polymerization proceeds efficiently. This compound is identified as an autoxidizer.

Summary of the Invention

The present invention provides a novel photoinitiator composition and photohardenable compositions and imaging systems employing the same. The photoinitiator system of the present invention is characterized in that it includes an O-acylthiohydroxamate or an N-alkoxypyridinethione as an autoxidizer. In addition to the autoxidizer, the photoinitiator must include an absorber, i.e., a compound which absorbs actinic radiation and generates free radicals alone or in conjunction with a compound (herein referred to as a "co-initiator") which quenches the excited absorber and generates free radicals.

Accordingly, one manifestation of the present invention is a photoinitiator composition comprising an absorber and an O-acylthiohydroxamate or an N-alkoxypyridinethione.

Another manifestation of the present invention is a photoinitiator composition including an absorber, a coinitiator, and an O-acylthiohydroxamate or an N-alkoxypyridinethione. Preferably, the co-initiator is an N,N-dialkylaniline or a thiol and still more preferably a thiol.

The present inventions also provides photohardenable compositions containing the aforementioned photoinitiator compositions These compositions, in their simplest form, include a free radical addition polymerizable or crosslinkable material, and the aforementioned photoinitiator composition which includes an O-acylthiohydroxamate as an autoxidizer.

Still more particularly, the present invention relates to photosensitive materials wherein the aforementioned photohardenable compositions are provided on a substrate or encapsulated as described in U.S. Pat. Nos. 4,399,209 and 4,562,137 to control the release of an image-forming agent such as a color precursor.

In the most preferred embodiments of the invention these compositions contain an O-acylthiohydroxamate in combination with a thiol.

O-acylthiohydroxamates and N-alkoxypyridinethiones useful in the present invention can be generally represented by the formula (I):

where T represents a straight chain, branched chain or cyclic alkyl group having 1 to 30 carbon atoms, or a group of the formula —COR where R represents a straight chain, branched chain or cyclic alkyl group or an aryl substituted alkyl group wherein the alkyl group is defined as above; A represents —S—, —NR'—, —NR'CO—, or a direct bond, R' represents an alkyl group having 1 to 20 carbon atoms, an aryl group such as a phenyl group or a substituted aryl group, and Z represents the atoms necessary to complete a 5 or 6 membered saturated or unsaturated hetorocyclic ring which may be condensed with a substituted or unsubstituted mononuclear or polynuclear aromatic ring. More particularly, R represents a straight chain, branched chain, or cyclic alkyl group having 1 to 30 carbon atoms such as cyclohexyl and n—$C_{15}H_{31}$ or R may represent an alkyl group substituted by one or more aryl groups, for example, R may represent a 1,1-diphenethyl group.

A in combination with Z may represent the atoms necessary to complete a ring selected from the group consisting of a substituted or unsubstituted N-oxy pyridine-2 thione ring, N-oxy (benz)thiazolin-2-thione ring, N-oxy (benz)imidazol-2-thione ring, N-oxy(benz)oxazolin-2-thione ring, N-oxy (benz)selenazolin-2-thione ring, N-oxy (benz)pyrimidine-2-thione ring, and N-oxy 3-alkyl or 3-aryl substituted-2-thioxo-1,2-dihydroquinazoline-4-(3H)-one rings.

Detailed Description of the Invention

O-acylthiohydroxamates and N-alkoxypyridinethiones are known in the art as alkyl radical precursors. Several syntheses for these compounds are provided by D. Crick, "O-Acyl Thiohydroxamates New and Versatile Sources of Alkyl Radicals for Use in Organic Synthesis," *Aldrichimica Acta*, Vol. 20, No. 2, 1987. Included among them is the reaction of a suitably activated carboxylic acid with a salt of N-hydroxypyridine-2-thione; and treatment of 2-mercaptopyridine-N-oxide with phosgene in benzene to give a cyclic carbonate salt which on reaction with a carboxylic acid in refluxing benzene gives the O-acylthiohydroxamate.

N-alkoxypyridinethiones are reported in the literature by Beckwith and Hay, *J. Am. Chem. Soc.*, 1989, 111, 230–234.

The photoinitiator and photohardenable compositions in accordance with the present invention contain compounds of the formula II or III.

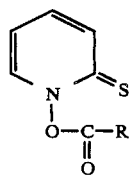

(II)

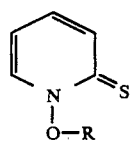

(III)

where R is defined as above.

Representative examples of O-acylthiohydroxamates useful in the present invention include O-esters of 4-methyl-N-hydroxythiazoline-2-thione; O-esters of 4-phenyl-N-hydroxythiazoline-2-thione; and aliphatic and alicyclic esters of N-hydroxypyridine-2-thione. Specific examples include: N-(3,3-Diphenylpropionyloxy)-pyridine-2-thione, N(1-methylcyclohexylcarbonyloxy)-pyridine-2-thione, o-palmitoyloxypyridine-2-thione, 3-palmitoyl-4-phenylthiozolin-2-(3H)-thione, and N-(3,3-Diphenylpropionyloxy)-4-phenylthiazolin-2-(3H)thione.

In addition to the autoxidizer, the photoinitiators of the present invention include an absorber, which is a compound which absorbs actinic radiation and generates a free radical or a compound which absorbs radiation and reacts with a co-initiator and generates a free radical. (The term "actinic radiation" as used herein includes, but is not limited to, visible light, ultraviolet radiation, and infrared radiation, as is determined by the sensitivity of the absorber compound).

Absorbers useful in the present invention include those compounds which are conventionally used or known to be useful as absorbers in the art. Examples are aryl benzophenones such as 4,4'-dimethoxybenzophenone, 4,4'-dichlorobenzophenone, 4,4'-bis(dimethylamino) benzophenone, benzanthone, 9-fluorenone; xanthones such as, xanthone, 2-methylxanthone, 2-dodecylxanthone, etc., thioxanthone such as thioxanthone, 2-methylthioxanthone, 2-dodecylthioxanthone, 2-chlorothioxanthone, 2- or 4-isopropylthioxanthone, etc.; coumarins such as 3-cinnamoyl-7-diethylaminocoumarin quinones; and compounds such as 2-methyl-1-[4-(methylthio)phenyl]-2-morpholinopropanone-1.

Preferred among these absorbers are thioxanthones, phenanthraquinones, the morpholino compounds, and ketocoumarins. (Examples of ketocoumarins useful in the present invention are disclosed in U.S. Pat. No. 4,713,312 to Adair et al.)

Another class of absorber which is particularly preferred for use in the present invention is ionic dye complexes. These complexes are stable, non-transient compounds as opposed to the transient collision generated encounter complexes, exciplexes or contact ion pairs which may be encountered in some photohardenable compositions. Examples of ionic dye complexes useful in the present invention are provided in U.S. Pat. Nos. 4,772,530 and 4,772,541.

One class of useful ionic dye complex is cationic dye-borate compounds represented by the formula (V)

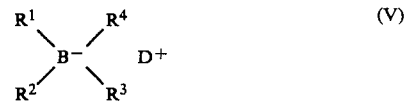

(V)

where $D^+$ is a cationic dye; and $R^1$, $R^2$, $R^3$, and $R^4$ are independently selected from the group consisting of alkyl, aryl, alkaryl, allyl, aralkyl, alkenyl, alkynyl, alicyclic and saturated or unsaturated heterocyclic groups.

Useful dyes form photoreducible, but dark stable, complexes with borate anions and can be cationic methine, polymethine, triarylmethane, indoline, thiazine, xanthene, oxazine and acridine dyes. More specifically, the dyes may be cationic cyanine, carbocyanine, hemicyanine, rhodamine and azomethine dyes. In addition to being cationic, the dyes should not contain groups which would neutralize or desensitize the complex or render the complex poorly dark stable.

Specific examples of useful cationic dyes are Methylene Blue, Safranine O, Malachite Green, cyanine dyes of the general formula (VI) and rhodamine dyes of the formula (VII):

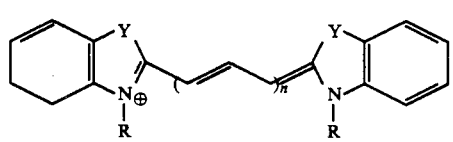

(VI)

n=0, 1, 2, 3,
R"=alkyl
Y=CH=CH, N—CH₃, C(CH₃)₂, O, S, Se

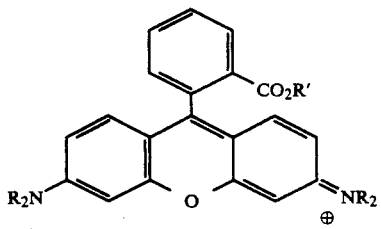

R''', R=alkyl, aryl, and any combination thereof

The borate anion is selected such that the boranyl radical generated upon exposure to light and after electron transfer to the dye readily dissociates with the formation of a radical as follows:

For example, particularly preferred anions are triphenylbutylborate and trianisylbutylborate anions because they readily dissociate to triphenylborane or trianisylborane and a butyl radical. On the other hand tetrabutylborate anion does not work well possibly because the tetrabutylborate radical is not stable and it readily accepts an electron back from the dye in a back electron transfer and does not dissociate efficiently. Likewise, tetraphenylborate anion is very poor because the phenyl radical is not easily formed.

Preferably, at least one but not more than three of $R^1$, $R^2$, $R^3$, and $R^4$ is an alkyl group. Each of $R^1$, $R^2$, $R^3$, and $R^4$ can contain up to 20 carbon atoms, and they typically contain 1 to 10 carbon atoms. More preferably $R_1$-$R_4$ are a combination of alkyl group(s) and aryl group(s) or aralkyl group(s) and still more preferably a combination of three aryl groups and one alkyl group.

Specific examples of cationic dye-borate anion compounds useful in the present invention are shown in U.S. Pat. No. 4,772,541.

The cationic dye-borate anion compounds can be prepared by reacting a borate salt with a dye in a counterion exchange in a known manner. See Hishiki, Y., *Repts. Sci. Research Inst.* (1953) 29, pp 72–79. Useful borate salts are sodium salts such as sodium triphenylbutylborate, sodium trianisylbutylborate and ammonium salts such as tetraethylammonium triphenylbutylborate.

Anionic dye compounds ar also useful as absorbers in the present invention. Anionic dye-iodonium ion compounds of the formula (VIII):

where $D^-$ is an anionic dye and $R^5$ and $R^6$ are independently selected from the group consisting of aromatic nuclei such as phenyl or naphthyl and n is 1 or 2; and anionic dye-pyryllium compounds of the formula (IX):

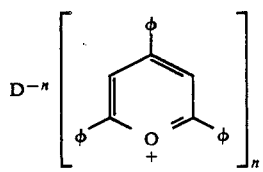

where $D^-$ and n are as defined above are typical examples of anionic dye complexes.

Representative examples anionic dyes include xanthene and oxonol dyes. For example Rose Bengal, eosin, erythrosin, and fluorscein dyes are useful. In addition to iodonium and pyryllium ions, other compounds of anionic dyes and sulfonium and phosphonium cations are potentially useful.

In addition to the foregoing compounds it may also be desirable to include an N,N-diallkylaniline compound in the photoinitiator as a co-initiator or as co-oxidant (depending upon the nature of the dialkylaniline).

Representative examples of N,N-dialkylanilines useful as co-initiators or autoxidizers in the present invention are represented by the formula (X)

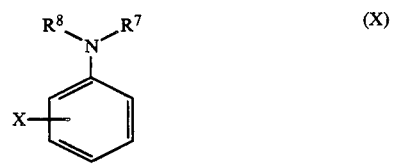

where $R^7$ and $R^8$ are alkyl groups having 1 to 6 carbon atoms and preferably 1 to 4 carbon atoms, n is an integer of 1 to 5, and X' is a substituent having a Hammett's (para) constant sigma ($\sigma$) in the range of $-0.9$ to 0.7. Preferred X have a Hammett's constant in the range of $-0.5$ to 0.5 and still more preferred X' have a constant in the range of $-0.2$ to 0.5. Representative examples of X' are a hydrogen atom, a cyano group, a halogen atom (e.g., fluorine, chlorine, or bromine), (an alkyl group having 1 to 12 carbon atoms), a hydroxyl group, an alkoxy group having 1 to 3 carbon atoms (e.g., ethoxy), an amino group, a dialkylamino group wherein the alkyl groups have 1 to 3 carbon atoms, an acyl group having 2 to 6 carbon atoms (e.g., acetyl), an acylamido group having 2 to 6 carbon atoms (e.g., acetylamido), an alkylsulfido group having 2 to 4 carbon atoms (e.g., —SCH$_3$), a phenyl group, a hydroxy group, a mercapto group, etc. When n is 2 or 3, the X' groups can be the same or different. The position of the X' substituent(s) affects the ability of the aniline to effect net hydrogen transfer.

Preferred N,N-dialkylanilines are dialkylanilines substituted in the ortho-, meta- or para- position by the following groups: alkyl group having 1 to 12 carbon atoms, 3,4-tetramethylene, phenyl, trifluoromethyl, acetyl, ethoxycarbonyl, carboxy, carboxylate, trimethylsilymethyl, trimethylsilyl, triethylsilyl, trimethylgermanyl, triethylgermanyl, trimethylstannyl, triethylstannyl, n-butoxy, n-pentyloxy, phenoxy, hydroxy, acetyloxy, methylthio, ethylthio, isopropylthio, thio(mercapto-), acetylthio, fluoro, chloro, bromo and iodo.

Representative examples of N,N-dialkylanilines useful in the present invention are 4-cyano-N,N-dimethylaniline, 4-acetyl-N,N-dimethylaniline, 4-bromo-N,N-dimethylaniline, ethyl 4-(N,N-dimethylamino)benzoate, 3-chloro-N,N-dimethylaniline, 4-chloro-N,N-dimethylaniline, 3-ethoxy-N,N-dimethylaniline, 4-fluoro-N,N-dimethylaniline, 4-methyl-N,N-dimethylaniline, 4-ethoxy-N,N-dimethylaniline, N,N-dimethylthioanicidine, 4-amino-N,N-dimethylaniline, 3-hydroxy-N,N-dimethylaniline, N,N,N',N'-tetramethyl-1,4-dianiline, 4-acetamido-N,N-dimethylaniline, ethyl p-(dimethylamino)benzoate (EPD), 2-n-butoxyethyl-4(dimethylamino)-benzoate, ethyl o-(dimethylamino)-benzoate, etc. 2,6-Diisopropyl-N,N-dimethylaniline, 2,6-diethyl-N,N-dimethylaniline, N,N,2,4,6-pentamethylaniline, and p-t-butyl-N,N-dimethylaniline) are particularly preferred.

In accordance with a preferred embodiment of the present invention, thiols such as mercaptobenzoxazoles, mercaptotetrazines, and mercaptotriazines are used as cooxidants in combination with O-acylthiohydroxamates or N-alkoxy-pyridinethiones. Specific examples of useful thiols include: 2-mercaptobenzothiazole, 6-ethoxy-2-mercaptobenzothiazole, 2-mercaptobenzoxazole, 4-methyl-4H-1,2,4-triazole-3-thiol, 2-mercapto-1-methylimidazole, 2-mercapto-5-methylthio-1,3,4-thiadiazole, 5-n-butylthio-2-mercapto-1,3,4-thiadiazole, 4-methoxybenzenethiol, 1-phenyl-1H-tetrazole-5-thiol, 4-phenyl-4H-1,2,4-triazole-3-thiol, 2-mercaptobenzimidazole, pentaerythritol tetrakis(mercaptoacetate), pentaerythritol tetrakis(3-mercaptopropionate), trimethylolpropane tris(mercaptoacetate), trimethylolpropane tris(3-mercaptopropionate), 4-acetamidothiophenol, mercaptosuccinic acid, dodecanethiol, 2-mercaptopyridine, 4-mercaptopyridine, 2-mercapto-3H-quinazoline, and 2-mercaptothiazoline. More particularly, preferred thiols include 2-mercaptobenzoxazole (MBO), 6-ethoxy-2-mercaptobenzo-thiazole (EMBT) and phenyl mercaptotetrazole (PMT).

Disulfides are also useful co-oxidants. Representive examples of disulfides include disulfides of the following 2-mercaptobenzothiazole, 6-ethoxy-2-mercaptobenzothiazole, 2-mercaptobenzoxazole, 4-methyl-4H-1,2,4-triazole-3-thio1,2-mercapto-1-methylimidazole, 2-mercapto-5-methylthio-1,3,4-thiadiazole, 5-n-butylthio-2-mercapto-1,3,4-thiadiazole, 4-methoxybenzenethiol, 1-phenyl-1H-tetrazole-5-thiol, 4-phenyl-4H-1,2,4-triazole-3-thio1,2-mercaptobenzimidazole, pentaerythritol tetrakis(mercaptoacetate), pentaerythritol tetrakis(3-mercaptoproprionate), trimethylolpropane tris(-mercaptoacetate), trimethylolpropane tris(3-mercaptopropionate), 4-acetamidothiophenol, mercaptosuccinic acid, dodecanethiol, 2-mercaptopyridine, 4-mercaptopyridine, 2-mercapto-3H-quinazoline, and 2-mercaptothiazoline, alkylthiophenol, alkoxythiophenol, chlorothiophenol, bromothiophenol, acylthiophenol, dialkylaminothiophenol, trifluoromethylthiophenol, hydroxythiophenol and alkylarylthiophenol wherein the number of carbons in the substituent groups ranges from 1 to 20. More particularly, preferred disulfides include disulfides of 2-mercaptobenzoxazole (MBO), 6-ethoxy-2-mercaptobenzothiazole (EMBT) and phenyl mercaptotetrazole (PMT).

The photoinitiator will be incorporated in the photohardenable composition in an amount sufficient to cause the composition to harden upon exposure to actinic radiation and more preferably in an amount sufficient to provide a high film speed. Typical compositions contain up to about 1 part of the absorber per 100 parts of the free radical polymerizable or crosslinkable compound and preferably about 0.2 to 0.5 parts per 100 parts of the free radical addition polymerizable or crosslinkable compound. The ratio will depend on the compounds selected, the extinction coefficients of the absorber, etc.

Photoinitiator systems in accordance with the present invention may contain about 0.5 to 8% by weight of the O-acylthiohydroxamate or N-alkoxpyridinethione based on the polymerizable monomer.

When present, the N,N-dialkylanilines are used in an amount of about 0.3 to 6% by weight based on polymerizable monomers and the thiols are used in an amount of about 0.5 to 10% by weight based on the amount of monomer.

The photoinitiator composition in accordance with the present invention can be used in combination with substantially any free radical addition polymerizable material. The most typical examples of a free radical addition polymerizable or crosslinkable material useful in the present invention are ethylenically unsaturated compounds and, more specifically, polyethylenically unsaturated compounds. These compounds include both monomers having one or more ethylenically unsaturated groups, such as vinyl or allyl groups, and polymers having terminal or pendant ethylenic unsaturation. Such compounds are well known in the art and include acrylic and methacrylic esters of polyhydric alcohols such as trimethylolpropane, pentaerythritol, and the like; and acrylate or methacrylate terminated epoxy resins, acrylate or methacrylate terminated polyesters, etc. Representative examples include ethylene glycol diacrylate, ethylene glycol dimethacrylate, trimethylolpropane triacrylate (TMPTA), pentaerythritol tetraacrylate, pentaerythritol tetramethacrylate, dipentaerythritol hydroxypentacrylate (DPHPA), hexanediol-1,6-dimethacrylate and diacrylate, and diethyleneglycol dimethacrylate and diacrylate.

Photohardenable compositions in accordance with the present invention may be coated upon a support in a conventional manner and used as a photoresist or in photolithography to form a polymer image or a resist image; or they may be encapsulated as described in U.S. Pat. No. 4,399,209 and used to control the release of an image-forming agent such as a color former in which case images are formed by reacting the color former with a color developer. The compositions may also be used in full color pancromatic imaging systems employing microencapsulated acrylates.

The color formers which are useful in the aforementioned embodiment are colorless electron donating type compounds and are well known in the art. Representative examples of such color formers include substantially colorless compounds having in their partial skeleton a lactone, a lactam, a sultone, a spiropyran, an ester or an amido structure such as triarylmethane compounds, bisphenylmethane compounds, xanthene compounds, fluorans, thiazine compounds, spiropyran compounds and the like. Crystal Violet Lactone and Copikem X, IV and XI are often used. The color formers can be used alone or in combination. A particularly preferred color former is described in U.S. Pat. No. 4,600,678.

The developer materials conventionally employed in carbonless paper technology are also useful in the present invention. Illustrative examples are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxy naphthoate, zinc 3,5 di-tert-butyl salicylate, zinc 3,5-di-(α-methylbenzyl)salicylate, oil soluble metal salts or phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120, zinc carbonate etc. and mixtures thereof.

A particularly preferred developer is a finely divided thermoplastic phenolic resin which can be coalesced by heating after transfer of the color former as described in U.S. application Ser. No. 073,036 filed July 14, 1987.

The present invention is illustrated in more detail by the following non-limiting examples.

Slide tests were performed to study the effect of O-acylthiohydroxamates on rates of polymerization in both the dye+ borate− and ketocoumarin initiator systems. The O-acylthiohydroxamates were studied in conjunction with 6-ethoxy-2-mercaptobenzothiazole (EMBT) in view of the thiol's reactivity toward O-acylthiohydroxamates to give disulfides and active alkyl radicals as described in the literature.

EXAMPLE 1

Solutions were made up as follows:
1. 1.2 g initiator A in 150 g TMPTA
2. 1.2 g initiator A 2 g EMBT in 150 g TMPTA
3. 25 g solution #2, 0.25 g N-palmitoyloxypyridine-2-thione
4. 25 g solution #2, 0.25 g 3-palmitoyloxy-4-phenylthiazolin-2-(3H)-thione
5. 25 g solution #2, 0.25 g N-(3,3-diphenylpropionyloxyl)-pyridine-2-thione (DPOPT)

INITIATOR A

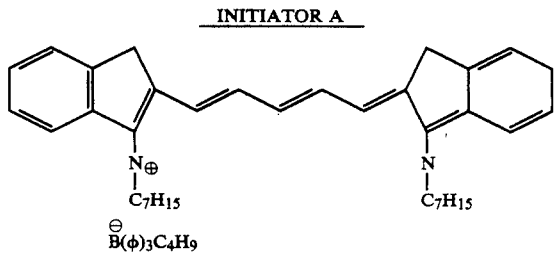

A drop of solution was placed between two microscope slides. Pressure was applied to give a thin layer. This was then irradiated with a monochromator at 650 nm with slight movement. Time to polymerization was recorded as an increase in resistance to movement. In solutions 3–5, some solids did not dissolve. The results are shown in Table 1 below.

TABLE 1

| Solution | Time to Polymerization (Seconds) | Average |
|---|---|---|
| 1 | 18, 15, 15, 16 | 16.0 |
| 2 | 11, 11, 10 | 10.7 |
| 3 | 7, 6, 5 | 6.0 |
| 4 | 15, 17, 11, 18 | 15.2 |
| 5 | 5, 7, 6 | 6.0 |

According to these results, pyridine based O-acylthiohydroxamates improved the rate of polymerization.

EXAMPLE 2

To distinguish between the effects of the thiol, the O-acylthiohydroxamates, and the synergy between the two, solutions were made up as follows:
1. 1.2 g Initiator A in 150 g TMPTA
2. 0.4 g Initiator A, 0.67 g EMBT in 50 g TMPTA
3. 25 g Solution #1, 0.25 g N-(3,3-phenylpropionyloxy)-pyridine-2-thione (DPOPT)
4. 25 g Solution #2 +0.25 g N-(3,3-diphenylpropionyloxy)-pyridine-2-thione (DPOPT)

Again, a drop of solution was pressed between two microscope slides and irradiated at 650 nm with a monochromator. The results are shown in Table 2.

TABLE 2

| Solution | Time to Polymerization (Seconds) | Average |
|---|---|---|
| 1 | 24, 20, 22, 20, 25, 17, 25 | 21.9 |
| 2 | 10, 10, 10 | 10.0 |
| 3 | 24, 18, 19, 16, 15, 16, 17, 20 | 18.1 |
| 4 | 8, 7, 7 | 7.3 |

Apparently, the greatest improvement is achieved with the use of both the thiol and the O-acylthiohydroxamates.

EXAMPLE 3

Slide tests with solutions of a ketocoumarin in TMPTA were also performed. Exposures were done with a monochromator at 450 nm. Because of the absorption of DPOPT at 360 nm, a solution of this and a thiol in the absence of initiator was exposed at 360 nm to detect possible photoinitiation properties (solutions #5, #6).

The following solutions were prepared:
1. 0.9 g Initiator B (7-diethylamino-3-cinnamoyl coumarin), 1.5 g 2,6-diisopropyl-N,N-dimethylaniline (DIDMA) in 150 g TMPTA
2. 50 g Solution #1, 0.5 g DPOPT
3. 25 g Solution #1, 0.25 g EMBT
4. 25 g Solution #2, 0.25 g EMBT
5. 0.25 g DPOPT, 0.25 g EMBT in 25 g TMPTA
6. 0.25 g DPOPT in 25 g TMPTA The results are shown in Table 3.

TABLE 3

| (nm) | Solution | Time to Polymerization (Seconds) | Average |
|---|---|---|---|
| 450 | 1 | 17, 13, 15, 23, 21, 18 | 17. |
| 450 | 2 | 23, 25 | 24. |
| 450 | 3 | 24, 25 | 24. |
| 450 | 4 | 10, 14, 9, 10 | 10. |
| 360 | 5 | 12, 11, 13 | 12. |
| 360 | 6 | >120 | >2 m |

According to these results, the synergistic effect of the O-acylthiohydroxamate and thiol produced a significant improvement in this ketocoumarin system. Over a stop improvement in sensitivity was shown by these numbers. The O-acylthiohydroxamate and thiol could polymerize TMPTA when irradiated at 360 nm in the absence of any other photoinitiator.

EXAMPLE 4

A technique was developed to give somewhat quantitative sensitometric data. A small amount of monomer solution is placed on an HPLC filter supported on 1 mil mylar. The solution is spread over the filter, another piece of mylar is placed on top, and the sandwich is run between pressure rollers. This gives a thin, even film. Exposure through a stepwedge produces a latent image. Development of this image can be performed in several ways. The mylar can be peeled from the filter, and the remaining monomer solution can be transferred to a receiver sheet to give an image. In addition, the remaining monomer can be washed from the filter, leaving areas of empty capillaries and areas of capillaries filled with polymer. At this point, the filter can be refilled with an image dye and transferred to produce an image, or the density of a background can be measured through the filter. The areas filled with polymer will be more transparent than the unfilled areas. In this way, a reverse H&D curve can be generated.

In this particular experiment, polyester HPLC filters of 7-10 micron thickness and 0.4 micron pore size were used. Exposure was achieved using a monochromator at the appropriate wavelength. After exposure, the remaining monomer was then transferred to a receiver sheet. The density of the photoinitiator of the transferred monomer was measured.

Solutions of monomer, photoinitiator, hydrogen donor, thiol, and the o-acylthiohydroxamater were prepared as follows:
1. 0.9 g Initiator C, 150 g TMPTA
2. 0.9 g Initiator C, 1.5 g DIDMA, 150 g TMPTA
3. 0.9 g Initiator C, 2.0 g EMBT, 150 g TMPTA
4. 25 g Solution #3. 0.25 g DIDMA
5. 10 g Solution #3, 0.1 g DPOPT, 0.1 g DIDMA
6. 10 g Solution #3, 0.1 g DPOPT
7. 0.06 g SI-253, 0.1 g DPOPT, 0.1 g DIDMA, 10 g TMPTA
8. 0.1 g DPOPT, 0.133 g EMBT, 0.1 g DIDMA, 10 g TMPTA

INITIATOR C

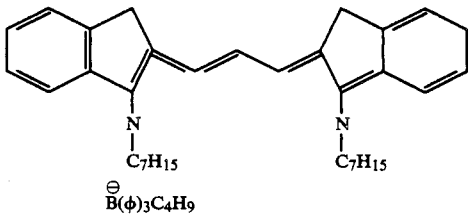

A drop of solution was spread evenly on an HPLC filter. This was then sandwiched between two pieces of 1 mil mylar and run through pressure rollers. An exposure was made through a stepwedge (3 steps=1 stop), for two minutes at 550 nm. This produced a latent image. Transfer of the remaining monomer to a receiver sheet gave an image. The density of the photoinitiator was measured with a densitometer through a green filter. A small difference in the shoulder speed with the addition of DPOPT appeared to be very minimal. The increase in toe speed was measured to be about 0.5 steps, and the increase at $D_{50}$ was about 0.5 steps.

The synergistic effect of EMBT and DPOPT gave an increase in Solution #3 to Solution #6 of 2 steps in the shoulder and about 1.2 steps at $D_{50}$. No increase in toe sensitivity was apparent. A one step gain in toe speed and the speed at $D_{50}$ (50% of maximum density) was achieved with the addition of DPOPT to a solution of Initiator C, EMBT, and DIDMA in TMPTA. The shoulder gained about 1.5 step because of the addition. Solution #8 (containing no initiator) did not image when exposed at 550 nm in this time frame.

EXAMPLE 5

To evaluate our ketocoumarin-based system, solutions in TMPTA were prepared.
1. 0.9 g Initiator B, 1.5 g DIDMA, 150 g TMPTA
2. 0.9 g Initiator B, 2.0 g EMBT, 150 g TMPTA
3. 25 g Solution #2, 0.25 g DIDMA
4. 10 g Solution #2, 0.1 g DIDMA, 0.1 g DPOPT
5. 10 g Solution #2, 0.1 g DPOPT
6. 0.06 g SI-096, 0.1 g DIDMA, 0.1 g DPOPT, 10 g TMPTA
7. 0.1 g DIDMA, 0.132 g EMBT, 0.1 g DPOPT, 10 g TMPTA The procedure described in Example 4 was used to evaluate these samples. The samples were irradiated at 450 nm for twelve minutes. The yellow density of the transferred monomer was read through a blue filter.

A 2 to 2½ steps gain in shoulder speed was achieved with the addition of DPOPT. The toe gained about 2 steps and the speed at $D_{50}$ gained about 2½ steps.

A solution containing Initiator B and EMBT only did not image at all under these exposure conditions. The addition of DPOPT caused polymerization to occur. There is a dramatic impact on the rate of polymerization with EMBT and DPOPT.

Solutions of Initiator B, EMBT, and DIDMA with and without DPOPT were evaluated to investigate synergies between any or all of these three components.

The overall gain in sensitivity with the addition of EMBT was less than ½ step, but with the addition of DPOPT, the gain was significant. The shoulder gained about 3½ steps, and the toe gained a little over 3 steps. The speed increase at $D_{50}$ was almost 4 steps.

Having described the invention in detail and by reference to preferred embodiments thereof, it will be apparent that modifications and variations are possible without departing from the scope of the invention defined in the appended claims.

What is claimed is:

1. A photohardenable composition comprising a free radical addition polymerizable or crosslinkable material and a photoinitiator composition, said photoinitiator composition including a compound which absorbs actinic radiation and directly or indirectly generates free radicals, and an O-acylthiohydroxamate or an N-alkoxypyridinethione.

2. The composition of claim 1 wherein said O-acylthiohydroxamate or N-alkoxypyridinethione is a compound of the formula (I):

where T represents a straight chain, branched chain or cyclic alkyl group having 1 to 30 carbon atoms, or a group of the formula —OCR where R represents an alkyl group, A is a member selected from the group consisting of a direct bond, —S—, —NR'CO— and —NR'—; R' represents an alkyl group or an aryl group, and Z represents the atoms necessary to complete a saturated or unsaturated 5 or 6 membered heterocyclic ring which may be condensed with a mononuclear or polynuclear aromatic ring.

3. The composition of claim 2 wherein said composition additionally contains a thiol.

4. The composition of claim 2 wherein A in combination with Z represents the atoms necessary to complete a ring selected from the group consisting of a substituted or unsubstituted N-oxy pyridine-2 thione ring, N-oxy (benz)thiazolin-2-thione ring, N-oxy (benz)imidazol-2-thione ring, N-oxy(benz)oxazolin-2-thione ring, N-oxy (benz)selenazolin-2-thione ring, N-oxy (benz)pyrimidine-2-thione ring, and N-oxy 3-alkyl or 3-aryl substituted-2-thioxo-1,2-dihydroquinazoline-4-(3H)-one rings.

5. The composition of claim 3 wherein said thiol is selected from the group consisting of 2-mercaptobenzothiazole, 6-ethoxy-2-mercaptobenzothiazole, 2-mercaptobenzothiazole, 2-mercaptobenzoxazole, and phenylmercaptotetrazole.

6. The composition of claim 4 wherein said compound which absorbs actinic radiation is a cyanine dye-borate complex.

7. A photosensitive material comprising a support having a layer of a photohardenable composition on the surface thereof, said photohardenable composition comprising free radical addition polymerizable or cross-linkable material and a photoinitiator composition, said photoinitiator composition including a compound which absorbs actinic radiation and directly or indirectly generates free radicals, and an O-acylthiohydroxamate or an N-alkoxypyridinethione.

8. The photosensitive material of claim 7 wherein said O-acylthiohydroxamate or N-alkoxypyridienthione is a compound of the formula (I):

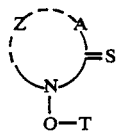

(I)

where T represents a straight chain, branched chain or cyclic alkyl group having 1 to 30 carbon atoms, or a group of the formula —OCR where R represents an alkyl group, A is a member selected from the group consisting of a direct bond, —S—, NR'CO— and —NR'—; R' represents an alkyl group or an aryl group, and Z represents the atoms necessary to complete a saturated or unsaturated 5 or 6 membered heterocyclic ring which may be condensed with a mononuclear or polynuclear aromatic ring.

9. The photosensitive material of claim 8 wherein said photohardenable composition additionally contains a thiol.

10. The photosensitive material of claim 9 wherein said thiol is selected from the group consisting of 2-mercaptobenzothiazole, 6-ethoxy-2-mercaptobenzothiazole, 2-mercaptobenzothiazole, 2-mercaptobenzoxazole, and phenylmercaptotetrazole.

11. The photosensitive material of claim 10 wherein said compound which absorbs actinic radiation is a cyanine dye-borate complex.

12. The photosensitive material of claim 8 wherein A in combination with Z represents the atoms necessary to complete a ring selected from the group consisting of a substituted or unsubstituted N-oxy pyridine-2 thione ring, N-oxy (benz)thiazolin-2-thione ring, N-oxy (benz)imidazol-2-thione ring, N-oxy(benz)oxazolin-2-thione ring, N-oxy (benz)selenazolin-2-thione ring, N-oxy (benz)pyrimidine-2-thione ring, and N-oxy 3-alkyl or 3-aryl substituted-2-thioxo-1,2-dihydroquinazoline-4-(3H)-one rings.

13. The photosensitive material of claim 6 wherein said photohardenable composition is microencapsulated with a color former.

* * * * *